(12) United States Patent
Osumi

(10) Patent No.: US 11,979,124 B2
(45) Date of Patent: May 7, 2024

(54) CHARGE AMPLIFIER, FORCE SENSOR, AND ROBOT

(71) Applicant: SEIKO EPSON CORPORATION, Tokyo (JP)

(72) Inventor: Noriyuki Osumi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 589 days.

(21) Appl. No.: 17/197,338

(22) Filed: Mar. 10, 2021

(65) Prior Publication Data

US 2021/0288625 A1 Sep. 16, 2021

(30) Foreign Application Priority Data

Mar. 12, 2020 (JP) ................................ 2020-042697

(51) Int. Cl.
  *H03F 3/70* (2006.01)
  *B25J 13/08* (2006.01)
  *B25J 19/02* (2006.01)
  *H03F 1/02* (2006.01)

(52) U.S. Cl.
  CPC .............. *H03F 3/70* (2013.01); *B25J 13/085* (2013.01); *B25J 19/028* (2013.01); *H03F 1/02* (2013.01); *H03F 2200/468* (2013.01)

(58) Field of Classification Search
  CPC ........ H03F 3/70; H03F 1/02; H03F 2200/468; H03F 3/45475
  See application file for complete search history.

(56) References Cited

U.S. PATENT DOCUMENTS

| | | | | |
|---|---|---|---|---|
| 5,252,928 | A | * 10/1993 | Giorgetta | .................. H03F 3/70 330/85 |
| 2002/0153957 | A1 | * 10/2002 | Jordanov | ................ H03F 3/087 330/308 |
| 2004/0183398 | A1 | * 9/2004 | Kashiwase | ................ H03F 3/70 310/319 |
| 2010/0237228 | A1 | * 9/2010 | Reshef | .................. H04N 25/709 250/214 A |
| 2012/0161868 | A1 | 6/2012 | Yayama et al. | |
| 2012/0268202 | A1 | * 10/2012 | Amstutz | .................. G01L 9/08 330/69 |

(Continued)

FOREIGN PATENT DOCUMENTS

| | | | |
|---|---|---|---|
| JP | 11-148878 | 6/1999 | |
| JP | 2004289278 A | * 10/2004 | ........... G01L 23/222 |

(Continued)

*Primary Examiner* — Francis C Gray
(74) *Attorney, Agent, or Firm* — Rankin, Hill & Clark LLP

(57) ABSTRACT

A charge amplifier includes: an input line thorough which an electric charge signal is propagated; an integration circuit including an input terminal coupled to the input line and an output terminal that outputs the voltage signal; a reset switch configured to reset the voltage signal by closing between the input terminal and the output terminal; a leakage current correction circuit including a first resistance circuit and a first switch coupled in series in this order between a first node, which has a first potential different from a potential of the input line, and the input line; and a control circuit configured to control the first switch based on the voltage signal so as to cancel at least a part of a leakage current flowing through the integration circuit.

11 Claims, 11 Drawing Sheets

(56) References Cited

U.S. PATENT DOCUMENTS

| | | | |
|---|---|---|---|
| 2018/0149530 A1* | 5/2018 | Yamamura | G01L 1/16 |
| 2018/0313704 A1 | 11/2018 | Yamamura et al. | |
| 2019/0145798 A1* | 5/2019 | Kamiya | B25J 9/1694 |
| | | | 700/258 |
| 2020/0264039 A1* | 8/2020 | Surendranath | H03F 3/087 |
| 2020/0408618 A1* | 12/2020 | Adachi | G01L 5/009 |

FOREIGN PATENT DOCUMENTS

| | | | | |
|---|---|---|---|---|
| JP | 2012-169712 | | 9/2012 | |
| JP | 6269800 B2 | * | 1/2018 | ............ B25J 13/085 |

* cited by examiner

CHARGE AMPLIFIER, FORCE SENSOR, AND ROBOT

The present application is based on, and claims priority from JP Application Serial Number 2020-042697, filed Mar. 12, 2020, the disclosure of which is hereby incorporated by reference herein in its entirety.

BACKGROUND

1. Technical Field

The present disclosure relates to a charge amplifier, a force sensor, and a robot.

2. Related Art

Conventionally, as show in JP-A-11-148878, a charge amplifier is known in which a diode is provided with a reverse bias in an input line to cancel a leakage current generated in a field effect transistor (FET) and a capacitor by the leakage current of the diode.

JP-A-11-148878 is an example of the related art.

In JP-A-11-148878, the leakage current of the FET varies with the potential difference between the source and drain of the FET. Accordingly, the leakage current of the FET is changed by the change of an input and output signal of an integration circuit, and there is possibility that the output signal characteristics are affected.

SUMMARY

One aspect is a charge amplifier configured to convert an electric charge signal into a voltage signal, the charge amplifier includes: an input line through which the electric charge signal is propagated; an integration circuit including an input terminal coupled to the input line and an output terminal that outputs the voltage signal; a reset switch configured to reset the voltage signal by closing between the input terminal and the output terminal; a leakage current correction circuit including a first resistance circuit and a first switch coupled in series in this order between a first node, which has a first potential different from a potential of the input line, and the input line; and a control circuit configured to control the first switch based on the voltage signal to cancel at least a part of a leakage current flowing through the integration circuit.

Another aspect is a force sensor including the charge amplifier and a force detection element configured to detect an external force and output the electric charge signal corresponding to the external force.

Another aspect is a robot including the force sensor.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Hereinafter, preferred embodiments of the present disclosure will be described with reference to the drawings. The drawings used are for convenience of explanation. Note that the embodiments described below do not unduly limit the content of the present disclosure in the claims. Also, all of the configurations described below are not necessarily essential components of the present disclosure. In the present embodiments, a force sensor including a charge amplifier (Q-V conversion circuit) that converts an electric charge signal into a voltage signal, and a robot including the force sensor will be described as an example.

1. Force Sensor

1.1 First Embodiment

Configuration of Force Sensor

Figure 1:
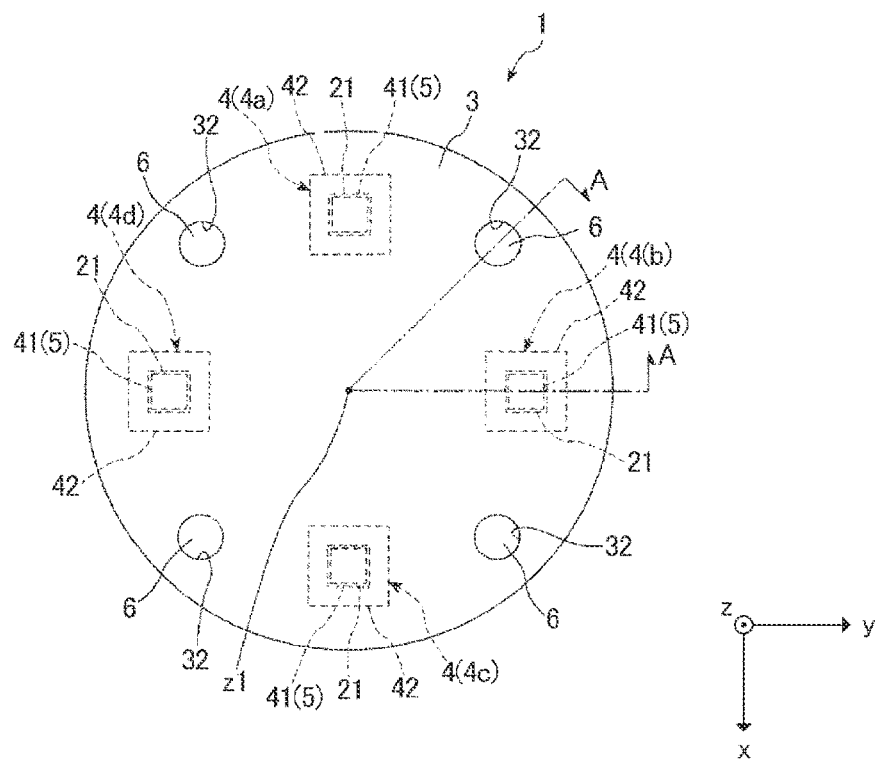
FIG. 1 is a plan view showing a configuration of a force sensor according to a first embodiment.
Figure 2:
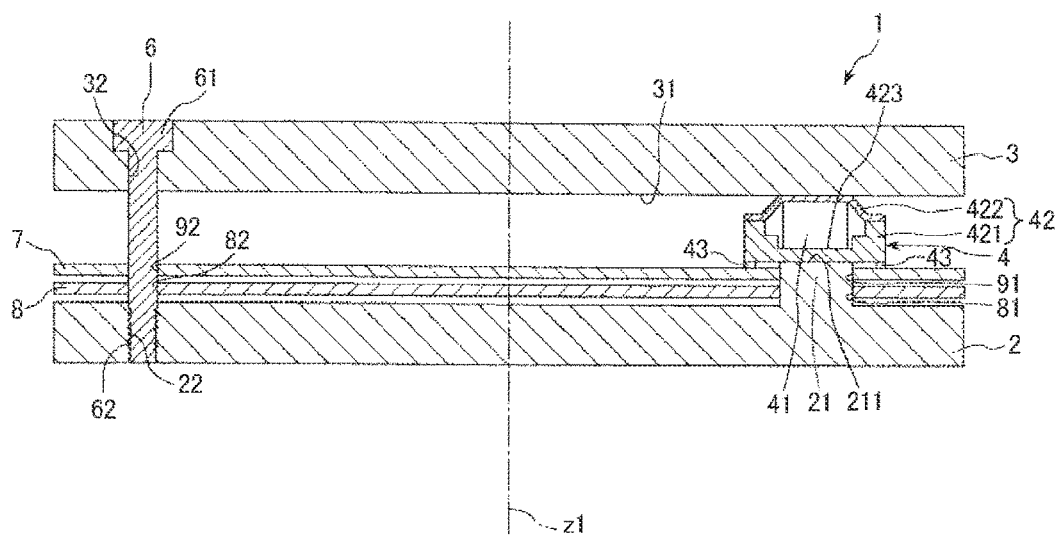
FIG. 2 is a cross-sectional view taken along line A-A of the force sensor shown in FIG. 1.
Figure 3:
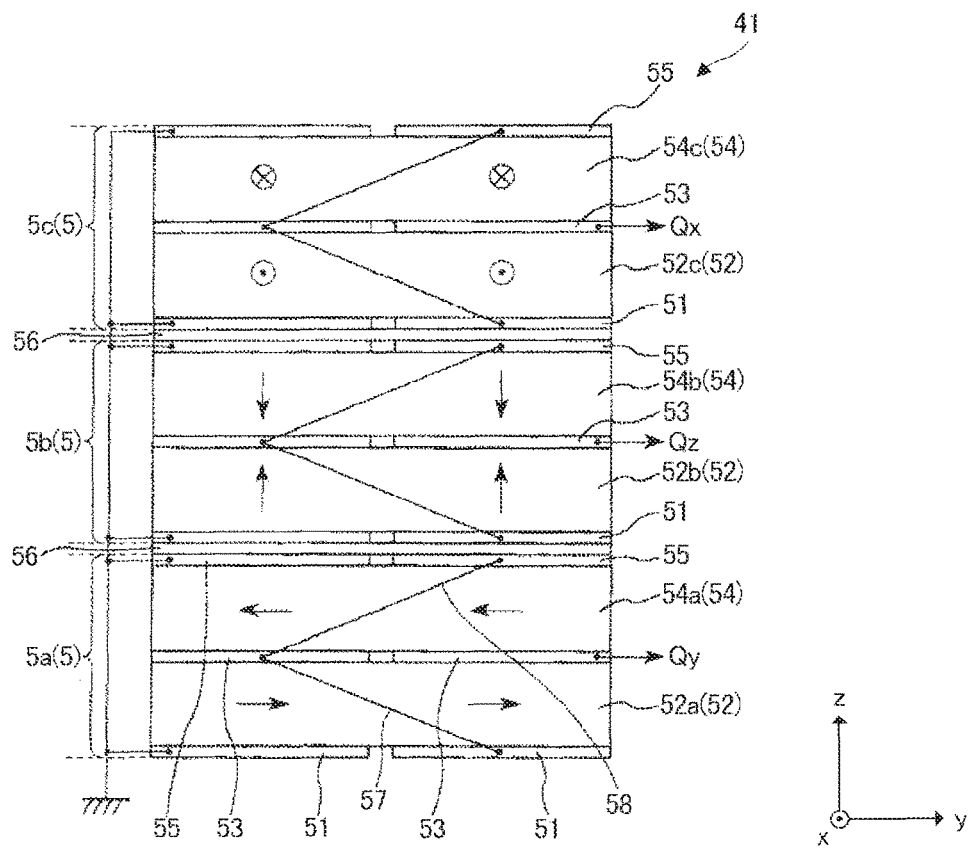
FIG. 3 is a cross-sectional view of a force detection module included in the force sensor shown in FIGS. 1 and 2.
Figure 4:
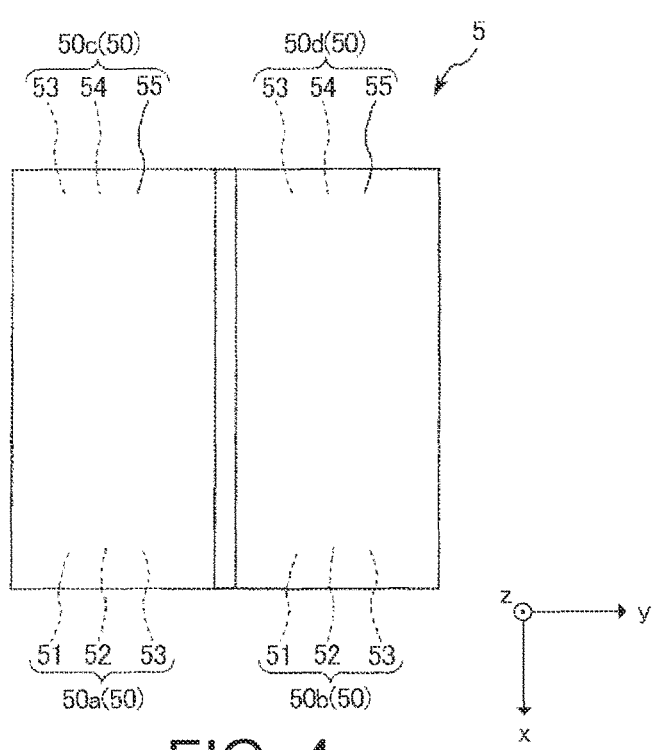
FIG. 4 is a plan view of a force detection element included in the force sensor shown in FIGS. 1 and 2.

First, a configuration of a force sensor 1 in a first embodiment will be described with reference to FIGS. 1 to 4. FIG. 1 is a plan view showing a configuration of the force sensor 1 according to the first embodiment. FIG. 2 is a cross-sectional view taken along line A-A of the force sensor 1 shown in FIG. 1. FIG. 3 is a cross-sectional view of a force detection module 41 included in the force sensor 1 shown in FIGS. 1 and 2. FIG. 4 is a plan view of a force detection element 5 included in the force sensor 1 shown in FIGS. 1 and 2. In each of FIGS. 1, 3, and 4, an x-axis, a y-axis, and a z-axis are illustrated as three axes orthogonal to each other. In the following description, the front end side of the arrow shown in each axis may be referred to as "+", and the base end side may be referred to as "−". Also, a direction parallel to the x-axis may be referred to as an "x-axis direction", a direction parallel to the y-axis may be referred to as a "y-axis direction", and a direction parallel to the z-axis may be referred to as a "z-axis direction". Furthermore, the +z-axis direction side may be referred to as an "upper side", the −z-axis direction side may be referred to as a "lower side", and a view seen from the z-axis direction may be referred to as a "plan view".

The force sensor 1 shown in FIG. 1 is a six-axis force sensor that outputs signals of six-axis components corresponding to an applied external force. Here, the six-axis components include translational force components in the three-axis directions of the x-axis, the y-axis, and the z-axis, and rotational force components around the three axes of the x-axis, the y-axis, and the z-axis.

As shown in FIG. 2, the force sensor 1 includes a first base portion 2, a second base portion 3 that is spaced apart from the first base portion 2, a sensor device 4, an analog circuit board 7, and a digital circuit board 8 that are provided between the first base portion 2 and the second base portion 3, and a pressurization bolt 6 that fixes the first base portion 2 and the second base portion 3 to each other. In the following description, the force sensor 1 includes four sensor devices 4, and four pressurization bolts 6. However, the number of the sensor devices 4 and the pressurization bolts 6 included in the force sensor 1 is not limited to four.

In the force sensor 1, each sensor device 4 detects an applied external force, and the analog circuit board 7 and the digital circuit board 8 process a signal corresponding to the detected external force, thereby outputting a signal of six-axis components corresponding to the external force applied to the force sensor 1.

The first base portion 2 is a substantially plate-shaped member having a circular outer shape in a plan view. The outer shape of the first base portion 2 is not limited to a circular shape, and may also be a polygonal shape such as a quadrangular shape or a pentagonal shape, an elliptical shape, or the like. As shown in FIGS. 1 and 2, a plurality of protrusions 21 are provided on a surface of the first base portion 2 on the second base portion 3 side at positions away from the axial line z1. The plurality of protrusions 21 are arranged at equal intervals along the same circumference about the axial line z1. A top surface 211, which is an end surface of each protrusion 21, is a flat surface having a quadrangular outer shape in a plan view. The shape of the top surface 211 is not limited to a quadrangular shape, and may also be, for example, a polygonal shape such as a pentagonal shape or a hexagonal shape, a circular shape, or an elliptical shape. Furthermore, the first base portion 2 is provided with a plurality of female screws 22 screwed to the pressurization bolts 6 at positions away from the axial line z1. The plurality of female screws 22 are arranged at equal intervals along the same circumference about the axial line z1.

As a constituent material of the first base portion 2, for example, a metal material such as stainless steel, ceramics, or the like is used. In FIG. 2, the protrusions 21 are formed integrally with the first base portion 2, but the protrusions 21 may be formed as separate members from the first base portion 2. In this case, the protrusions 21 and the first base portion 2 may be made of the same material or different materials.

The second base portion 3 is a substantially plate-shaped member having a circular outer shape in a plan view. The outer shape of the second base portion 3 is not limited to a circular shape, and may also be a polygonal shape such as a quadrangular shape or a pentagonal shape, an elliptical shape, or the like. The second base portion 3 is provided with a plurality of through holes 32 through which the pressurization bolts 6 are inserted at positions corresponding to the plurality of female screws 22 of the first base portion 2 described above and away from the axial line z1. A stepped part engaged with a head part 61 of the pressurization bolt 6 is formed in an upper part of each through hole 32.

As a constituent material of the second base portion 3, similarly to the above-described first base portion 2, a metal material such as stainless steel, ceramics, or the like is used, for example. The second base portion 3 may also be made of the same material as the first base portion 2, or may also be made of different materials.

As shown in FIG. 2, each of the four sensor devices 4 includes a force detection module 41, and a package 42 that houses the force detection module 41.

The package 42 includes a base portion 421 having a recess whose bottom surface is the installation surface 423 on which the force detection module 41 is installed, and a lid 422 joined to the base portion 421, and the recess of the base portion 421 is sealed by the lid 422. With this configuration, the package 42 protects the force detection module 41.

The base portion 421 is provided on the top surface 211 of the protrusion 21 of the first base portion 2 described above. A plurality of terminals 43 electrically coupled to the analog circuit board 7 are provided on the lower surface of the base portion 421. The plurality of terminals 43 are electrically coupled to the force detection module 41 via through electrodes (not shown) penetrating the base portion 421. As a constituent material of the base portion 421, for example, an insulating material such as ceramics is used.

The lid 422 is a substantially plate-shaped member in which a surface of the lid 422 on the side of the base portion 421 is in contact with the force detection module 41, and a surface on the side opposite to the base portion 421 is in contact with the second base portion 3. As a constituent material of the lid 422, for example, various metal materials such as stainless steel are used. The base portion 421 and the lid 422 may also be made of the same material, or may also be made of different materials. As shown in FIG. 1, the shape of the force detection module 41 and the package 42 in a plan view is illustrated as a quadrangular shape. However, the shape of the force detection module 41 and the package 42 in a plan view may also be other polygonal shapes such as a pentagonal shape and a hexagonal shape, a circular shape, and an elliptical shape, for example.

The force detection module 41 outputs an electric charge Qx as a component in the x-axis direction, an electric charge Qy as a component in the y-axis direction, and an electric charge Qz as a component in the z-axis direction, according to an external force applied to the force detection module 41. Specifically, as shown in FIG. 3, the force detection module 41 includes a force detection element 5a that outputs an electric charge Qy corresponding to an external force parallel to the y-axis, a force detection element 5b that outputs an electric charge Qz corresponding to an external force parallel to the z-axis, and a force detection element 5c that outputs an electric charge Qx corresponding to an external force parallel to the x-axis. The force detection element 5a, the force detection element 5b, and the force detection element 5c are stacked in the order of the force detection element 5a, the force detection element 5b, and the force detection element 5c in the force detection module 41.

In the force detection module 41, an insulating adhesive 56 is interposed between the force detection element 5a and the force detection element 5b, and between the force detection element 5b and the force detection element 5c. The force detection elements 5a, 5b, and 5c are bonded by the adhesive 56. In the following description, when it is not necessary to distinguish the force detection elements 5a, 5b, and 5c from one another, the force detection elements may be simply referred to as force detection elements 5.

Each force detection element 5 includes two electrodes 51, a piezoelectric substance 52, two electrodes 53, a piezoelectric substance 54, and two electrodes 55. In the force detection element 5, the two electrodes 51, the piezoelectric substance 52, the two electrodes 53, the piezoelectric substance 54, and the two electrodes 55 are stacked in the order of the two electrodes 51, the piezoelectric substance 52, the two electrodes 53, the piezoelectric substance 54, and the two electrodes 55.

Each of the piezoelectric substances 52 and 54 has a plate shape or a sheet shape, and is made of quartz crystal, for example. The directions of the X-axes (electrical axes), which are crystal axes of the quartz crystals constituting the piezoelectric substances 52 and 54, are provided to be different from each other for each of the force detection elements 5a, 5b, and 5c. In FIG. 3, the direction of the X-axis in each of the force detection elements 5a, 5b, and 5c is indicated by an arrow.

Specifically, as shown in FIG. 3, the X-axis of the piezoelectric substance 52a, which is the piezoelectric substance 52 included in the force detection element 5a, is oriented from the −y side to the +y side in the y-axis direction, and the X-axis of the piezoelectric substance 54a, which is the piezoelectric substance 54 included in the force detection element 5a, is oriented from the +y side to the −y side in the y-axis direction. The X-axis of the piezoelectric substance 52b, which is the piezoelectric substance 52 included in the force detection element 5b, is oriented from the −z side to the +z side in the z-axis direction, and the X-axis of the piezoelectric substance 54b, which is the piezoelectric substance 54 included in the force detection element 5b, is oriented from the +z side to the −z side in the z-axis direction. The X-axis of the piezoelectric substance 52c, which is the piezoelectric substance 52 included in the force detection element 5c, is oriented from the −x side to the +x side in the x-axis direction, and the X-axis of the piezoelectric substance 54c, which is the piezoelectric substance 54 included in the force detection element 5c, is oriented from the +x side to the −x side in the x-axis direction.

The above-described piezoelectric substances 52a, 54a, 52c, and 54c are constituted of Y-cut quartz crystal plates, and the respective X-axis directions of the piezoelectric substances 52a, 52c, 54a, and 54c are positioned to be different by 90 degrees in the order of the piezoelectric substances 52a, 52c, 54a, and 54c. The piezoelectric substances 52b and 54b are constituted of X-cut quartz crystal plates and are positioned so that the directions of the X-axes are different from each other by 180 degrees.

The two electrodes 51, the two electrodes 53, and the two electrodes 55 are respectively provided side by side in the y-axis direction. The electrodes 51, 53, and 55 on one side in the y-axis direction are positioned to overlap each other in the z-axis direction, and the electrodes 51, 53, and 55 on the other side in the y-axis direction are positioned to overlap each other in the z-axis direction. The following description will be made on the assumption that the one side in the y-axis direction where the electrodes 51, 53, and 55 are arranged side by side corresponds to the left side in FIG. 4, and other side in the y-axis direction corresponds to the right side in FIG. 4.

As shown in FIG. 4, the electrodes 51 and 53 on the one side in the y-axis direction and the piezoelectric substance 52 between the electrodes 51 and 53 constitute a piezoelectric element 50a, and the electrodes 51 and 53 on the other side in the y-axis direction and the piezoelectric substance 52 between the electrodes 51 and 53 constitute a piezoelectric element 50b. Similarly, the electrodes 53 and 55 on the one side in the y-axis direction and the piezoelectric substance 54 between the electrodes 53 and 55 constitute a piezoelectric element 50c, and the electrodes 53 and 55 on the other side in the y-axis direction and the piezoelectric substance 54 between the electrodes 53 and 55 constitute a piezoelectric element 50d. In the following description, when it is not necessary to distinguish the piezoelectric elements 50a, 50b, 50c, and 50d from one another, they may be simply referred to as a piezoelectric element 50.

As described above, the force detection element 5 includes the piezoelectric elements 50a, 50b, 50c, and 50d, the piezoelectric elements 50a and 50b are located side by side in the y-axis direction in the same plane, and the piezoelectric elements 50c and 50d are located side by side in the y-axis direction in the same plane. In other words, the piezoelectric elements 50a and 50b are positioned so as not to overlap each other in a plan view, and the piezoelectric elements 50c and 50d are positioned so as not to overlap each other in a plan view.

The electrode 51 of the two electrodes 51 on the other side in the y-axis direction and the electrode 53 of the two electrodes 53 on the one side in the y-axis direction are electrically coupled to each other via a wiring 57. In this manner, the piezoelectric element 50a and the piezoelectric element 50b are electrically coupled in series. Similarly, the electrode 53 of the two electrodes 53 on the one side in the y-axis direction and the electrode 55 of the two electrodes 55 on the other side in the y-axis direction are electrically coupled to each other via a wiring 58. In this manner, the piezoelectric element 50c and the piezoelectric element 50d are electrically coupled in series.

In this manner, the piezoelectric elements 50a and 50b positioned so as not to overlap each other in a plan view are electrically coupled in series, and the piezoelectric elements 50c and 50d disposed so as not to overlap each other in a plan view are electrically coupled in series. This makes it possible to improve the S/N ratio without increasing the size of the force detection element 5, reducing the withstand load, and reducing the responsiveness.

A material constituting the electrodes 51, 53, and 55 may be any material as long as it can function as an electrode, and examples thereof include nickel, gold, titanium, aluminum, copper, iron, chromium, and alloy containing any of these materials. One of these materials or a combination of two or more of these materials is used.

The configuration of the force detection module 41 has been described above. However, the number of the force detection elements 5 included in the force detection module 41 and the number of the piezoelectric elements 50 constituting the force detection elements 5 are not limited to the numbers described above. Here, the force detection element 5, or the piezoelectric element 50 included in the force detection element 5 is an example of a detection element.

As shown in FIG. 2, the plurality of pressurization bolts 6 fix the first base portions 2 and the second base portions 3 to each other in a state where the force detection elements 5 included in the sensor devices 4 are sandwiched and pressurized. As shown in FIG. 2, one end portion of each pressurization bolt 6 is provided with a head part 61, and the other end portion thereof is provided with a male screw 62. The head part 61 of the pressurization bolt is engaged with the stepped part of the through hole 32, and the pressurization bolt 6 is inserted through the through hole 32 of the second base portion 3, and the male screw is screwed into the female screw 22. Because the first base portion 2 and the second base portion 3 are fixed to each other by the pressurization bolt 6, the force detection module 41 is pressurized between the top surface 211 and the lower surface 31 of the protrusion 21. Also, by appropriately adjusting the fastening force of the pressurization bolt 6, a predetermined amount of pressure in the z-axis direction can be applied as pressurization to the force detection module 41. As a constituent material of the pressurization bolt 6, for example, various metal material or the like are used. The positions where the pressurization bolts 6 are provided are not limited to the positions shown in FIG. 1.

The analog circuit board 7 is located between the first base portion 2 and the second base portion 3. In the analog circuit board 7, through holes 91 through which the protrusions 21 are inserted and through holes 92 through which the pressurization bolts 6 are inserted are formed. The analog circuit board 7 is coupled to the sensor devices 4 via the terminals 43, and is fixed to and supported by the first base portion 2. By positioning the analog circuit board 7 as described above, it is possible to shorten the length of the wiring that electrically couples the sensor devices 4 and the analog circuit board 7.

Figure 5:
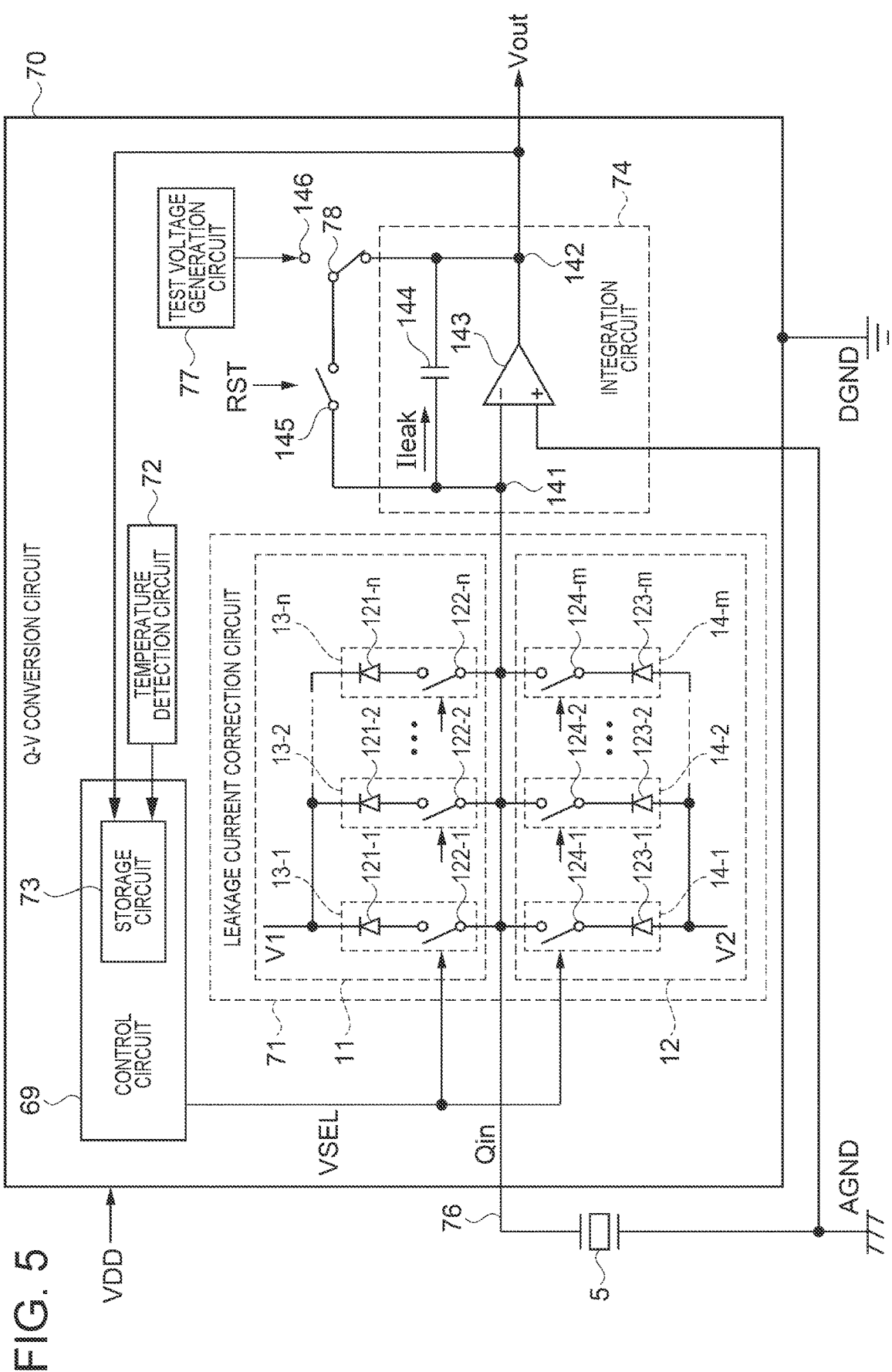
FIG. 5 is a block diagram showing an example of a configuration of a Q-V conversion circuit.

The analog circuit board 7 is electrically coupled to the plurality of terminals 43 included in each sensor device 4. The force detection module 41 outputs the electric charges Qx, Qy and Qz to the analog circuit board 7 via the plurality of terminals 43. The electric charges Qx, Qy, and Qz input to the analog circuit board 7 are converted into voltages Vx, Vy, and Vz, in the Q-V conversion circuit 70 shown in FIG. 5 provided in the analog circuit board 7, and then output. Details of the Q-V conversion circuit 70 that converts the electric charges Qx, Qy, and Qz into voltages Vx, Vy, and Vz and outputs the voltages Vx, Vy, and Vz will be described later.

The digital circuit board 8 is located between the first base portion 2 and the second base portion 3 described above, and between the first base portion 2 and the analog circuit board 7. This makes it possible to reduce the length of the wiring that electrically couples the analog circuit board 7 and the digital circuit board 8. In the digital circuit board 8, similarly to the analog circuit board 7, through holes 81 through which the protrusions 21 are inserted and through holes 82 through which the pressurization bolts 6 are inserted are formed. The digital circuit board 8 is fixed to and supported by the first base portion 2 by being fitted and bonded to the first base portion 2 or the protrusions 21.

The digital circuit board 8 includes an external force detection circuit (not shown) that calculates an external force based on the voltages Vx, Vy, and Vz output from the analog circuit board 7. This external force detection circuit includes, for example, an AD converter and an arithmetic circuit such as a CPU coupled to the AD converter. Based on the voltages Vx, Vy, and Vz input from the analog circuit board 7, the digital circuit board 8 outputs a signal of six-axis components including translational force components in three-axis directions of the x-axis, the y-axis, and the z-axis, and rotational force components around three axes of the x-axis, the y-axis, and the z-axis. Furthermore, the digital circuit board 8 outputs a reset signal RST for resetting the Q-V conversion circuit 70 to the analog circuit board 7.

Constituent materials of the analog circuit board 7 and the digital circuit board 8 include, for example, silicon.

Overview of Operation of Force Sensor

In the force sensor 1 configured as described above, based on the electric charges Qx, Qy, and Qz output from each sensor device 4, the analog circuit board 7 and the digital circuit board 8 output signals of six-axis components including translational force component in three-axis directions of the x-axis, the y-axis, and the z-axis, and rotational force components around three axes of the x-axis, the y-axis, and the z-axis.

Specifically, when external force is applied to the force sensor 1, the piezoelectric elements 50a, 50b, 50c, and 50d included in each of the force detection elements 5a, 5b, and 5c included in the force detection module 41 corresponding to each of the four sensor devices 4 shown in FIG. 1 are displaced. As a result, the force detection elements 5a, 5b, and 5c output electric charges Qx, Qy, and Qz corresponding to the displacements of the piezoelectric elements 50a, 50b, 50c, and 50d, respectively.

The analog circuit board 7 includes the Q-V conversion circuits 70 corresponding to the electric charges Qx, Qy, and Qz output from the four sensor devices 4, respectively. Specifically, the analog circuit board 7 is provided with three Q-V conversion circuits 70 corresponding to electric charges Qx, Qy and Qz output from the sensor device 4a shown in FIG. 1, three Q-V conversion circuits 70 corresponding to the electric charges Qx, Qy and Qz output from the sensor device 4b, three Q-V conversion circuits 70 corresponding to the electric charges Qx, Qy and Qz output from the sensor device 4c, and three Q-V conversion circuits 70 corresponding to the electric charges Qx, Qy and Qz output from the sensor device 4d.

Then, the three Q-V conversion circuits 70 corresponding to the respective electric charges Qx, Qy, and Qz output from the sensor device 4a generate voltages Vxa, Vya, and Vza, and output the voltages Vxa, Vya, and Vza to the digital circuit board 8. Similarly, the three Q-V conversion circuits 70 corresponding to the respective electric charges Qx, Qy, and Qz output from the sensor device 4b generate voltages Vxb, Vyb, and Vzb and output the voltages Vxb, Vyb, and Vzb to the digital circuit board 8, the three Q-V conversion circuits 70 corresponding to the respective electric charges Qx, Qy, and Qz output from the sensor device 4c generate voltages Vxc, Vyc, and Vzc and output the voltages Vxc, Vyc, and Vzc to the digital circuit board 8, and the three Q-V conversion circuits 70 corresponding to the respective electric charges Qx, Qy, and Qz output from the sensor device 4d generate voltages Vxd, Vyd, and Vzd and output the voltages Vxd, Vyd, and Vzd to the digital circuit board 8. That is to say, the analog circuit board 7 in the present embodiment is provided with a total of twelve Q-V conversion circuits 70, and the twelve Q-V conversion circuits 70 output voltages Vxa, Vya, and Vza, voltages Vxb, Vyb, and Vzb, voltages Vxc, Vyc, and Vzc, and voltages Vxd, Vyd, and Vzd to the digital circuit board 8, based on the electric charges Qx, Qy, and Qz input from the corresponding sensor devices 4.

The arithmetic circuit such as a CPU provided in the digital circuit board 8 calculates a translational force component Fx in the x-axis direction, a translational force component Fy in the y-axis direction, a translational force component Fz in the z-axis direction, a rotational force component Mx around the x-axis, a rotational force component My around the y-axis, and a rotational force component Mz around the z-axis, based on the following equations (1) to (6) using voltages Vxa, Vya, and Vza, voltages Vxb, Vyb, and Vzb, voltages Vxc, Vyc, and Vzc, and voltages Vxd, Vyd, and Vzd input from the analog circuit board 7.

$$Fx = R1 \times (Vxa + Vxb + Vxc + Vxd)/4 \qquad \text{Formula (1)}$$

$$Fy = R1 \times (Vya + Vyb + Vyc + Vyd)/4 \qquad \text{Formula (2)}$$

$$Fz = R1 \times (Vza + Vzb + Vzc + Vzd)/4 \qquad \text{Formula (3)}$$

$$Mx = R2 \times (Vzd - Vzb)/2 \quad \text{Formula (4)}$$

$$My = R2 \times (Vzc - Vza)/2 \quad \text{Formula (5)}$$

$$Mx = R1 \times (Vxb - Vxd + Vya - Vyc)/4 \quad \text{Formula (6)}$$

As described above, in the force sensor 1, the applied external force is detected by the sensor devices 4, and signals corresponding to the external force detected by the sensor devices 4 are processed by the analog circuit board 7 and the digital circuit board 8, thereby outputting signals of six-axis components of the translational force components Fx, Fy, and Fz and the rotational force components Mx, My, and Mz. In addition to the calculation described above, the digital circuit board 8 may also perform, for example, correction to eliminate a difference in sensitivity between the conversion output circuits. Here, each of R1 and R2 shown in the equations (1) to (6) is a unit conversion constant for converting voltage into force.

Configuration of Q-V Conversion Circuit

Here, the configuration of the Q-V conversion circuit 70 provided on the analog circuit board 7 will be described with reference to FIG. 5. The Q-V conversion circuits 70 provided on the analog circuit board 7 have the same configuration. For this reason, in the following description, the electric charges Qx, Qy, and Qz output from the sensor device 4 and input to the Q-V conversion circuit 70 are referred to as an electric charge signal Qin, and the voltages Vx, Vy, and Vz output from the Q-V conversion circuit 70 based on the electric charge signal Qin are referred to as a voltage signal Vout.

FIG. 5 is a block diagram showing the configuration of the Q-V conversion circuit 70. As shown in FIG. 5, the Q-V conversion circuit 70 may include a control circuit 69, a leakage current correction circuit 71, a temperature detection circuit 72, an integration circuit 74, a test voltage generation circuit 77, a test switch 78, and a reset switch 145. The Q-V conversion circuit 70 is an example of a charge amplifier that converts the electric charge signal Qin into the voltage signal Vout.

The integration circuit 74 includes an input terminal 141 coupled to an input line 76, an output terminal 142 for outputting the voltage signal Vout, an operational amplifier 143, and a capacitor 144. The input line 76 is a wiring through which the electric charge signal Qin output from the force detection element 5 of the sensor device 4 is propagated. The force detection element 5 detects an external force and outputs an electric charge signal Qin corresponding to the detected external force. The input terminal 141 is coupled to a negative input terminal of the operational amplifier 143, and the output terminal 142 is coupled to an output terminal of the operational amplifier 143. One end of the capacitor 144 is coupled to the input terminal 141, and the other end thereof is coupled to the output terminal 142. One end of the reset switch 145 is coupled to the input terminal 141, and the other end thereof is coupled to the output terminal 142. That is to say, the capacitor 144 and the reset switch 145 are coupled in parallel with the operational amplifier 143 between the input terminal 141 and the output terminal 142. As the reset switch 145, for example, various switching elements such as a MOSFET (metal-oxide-semiconductor field-effect transistor) can be adopted.

Accordingly, an electric charge signal Qin is input to the negative input terminal of the operational amplifier 143 via the input line 76 and the input terminal 141. The operational amplifier 143 generates and outputs a voltage signal Vout corresponding to the input electric charge signal Qin. The voltage signal Vout output from the operational amplifier 143 is output from the integration circuit 74 via the output terminal 142. As a constituent material of the input line 76, for example, a metal material such as aluminum or copper is used. In other words, the input line 76 is a metal wiring.

The positive input terminal of the operational amplifier 143 is coupled to the analog ground AGND. The analog ground AGND is a reference potential of an analog signal in the Q-V conversion circuit 70, and is set to an intermediate potential between the potential of the voltage VDD and the potential of the digital ground DGND. The operational amplifier 143 converts the electric charge signal Qin input to the negative input terminal of the operational amplifier 143 into the voltage signal Vout, based on the potential of the analog ground AGND input to the positive input terminal. That is to say, the potential of the analog ground AGND is an example of the reference potential input to the integration circuit 74.

A reset signal RST is input to a control terminal of the reset switch 145. Two main electrodes of the reset switch 145 are coupled to the input terminal 141 and the output terminal 142, respectively. The reset switch 145 switches between closing and opening between the input terminal 141 and the output terminal 142 according to the reset signal RST. When the reset switch 145 is controlled to be in the closed state, various errors occurring in the integration circuit 74 are reset. That is to say, the reset switch 145 resets the voltage signal Vout of the integration circuit 74 by closing between the input terminal 141 and the output terminal 142.

As described above, the integration circuit 74 of the Q-V conversion circuit 70 converts an electric charge signal Qin into a voltage signal Vout and outputs the voltage signal Vout. However, due to the use environment of the Q-V conversion circuit 70, a temperature change, or the like, a leakage current Ileak is generated and flows into the capacitor 144 of the integration circuit 74, and as a result, so-called drift in which the potential of the voltage signal Vout output from the integration circuit 74 fluctuates may occur. This drift is also caused by variations in characteristics of components of the Q-V conversion circuit 70.

When drift occurs in the integration circuit 74 included in the Q-V conversion circuit 70, the voltage signal Vout of the integration circuit 74 increases or decreases over time, and the output of the integration circuit 74 may become saturated after certain period of time has elapsed. At this time, the leakage current Ileak flowing through the capacitor 144 and the drift ($\Delta$Vout/$\Delta$t) of the voltage signal Vout are expressed by the following equation (7). Here, t is time, and C is the capacitance value of the capacitor 144.

$$\Delta Vout/\Delta t = -Ileak/C \quad (7)$$

When the output of the integration circuit 74 is saturated, even if the electric charge signal Qin is input to the integration circuit 74, the electric charge signal Qin is not reflected in the voltage signal Vout output from the integration circuit 74. In other words, when the output of the integration circuit 74 is in the saturated state, the integration circuit 74 does not function as the integration circuit 74, and as a result, the Q-V conversion circuit 70 does not function normally.

The change in the voltage signal Vout due to the drift can be temporarily eliminated by discharging the electric charge stored in the capacitor 144 by the reset switch 145 described above. However, in order to control conduction between one end and the other end of the reset switch 145, it is necessary to stop the operation of the Q-V conversion circuit 70 and the force sensor 1 including the Q-V conversion circuit 70.

When such a force sensor 1 is used in an apparatus that involves continuous operation, the convenience of the apparatus may be significantly impaired. In order to reduce such drift, the Q-V conversion circuit 70 in this embodiment includes a leakage current correction circuit 71 coupled to the input line 76.

The leakage current correction circuit 71 includes a first correction circuit 11 coupled between the first node V1 and the input line 76, and a second correction circuit 12 coupled between the input line 76 and the second node V2. In the example shown in FIG. 5, the first correction circuit 11 includes a plurality of first circuits 13-1 to 13-$n$ coupled in parallel to each other between the first node V1 and the input line 76. Here, n is a natural number. That is to say, the number of the first circuits included in the first correction circuit 11 may be one or two or more. The second correction circuit 12 includes a plurality of second circuits 14-1 to 14-$m$ coupled in parallel to each other between the input line 76 and the second node V2. Here, m is a natural number. That is to say, the number of the second circuits included in the second correction circuit 12 may be one or two or more. Note that m may be equal to n, or may also be different from n.

The first circuit 13-1 includes a first resistance circuit 121-1 and a first switch 122-1 coupled in series in this order between the first node V1, which has a first potential different from the potential of the input line 76, and the input line 76. Similarly, the first circuit 13-2 includes a first resistance circuit 121-2 and a first switch 122-2 coupled in series in this order between the first node V1 and the input line 76. The first circuit 13-$n$ includes a first resistance circuit 121-$n$ and a first switch 122-$n$ coupled in series in this order between the first node V1 and the input line 76. Each of the first resistance circuits 121-1 to 121-$n$ includes a diode that is reverse-bias-coupled between the first node V1 and the input line 76. Hereinafter, the first resistance circuits 121-1 to 121-$n$ may be simply referred to as first resistance circuits 121, and the first switches 122-1 to 122-$n$ may be simply referred to as first switches 122, when there is no need to distinguish between them.

The second circuit 14-1 includes a second resistance circuit 123-1 and a second switch 124-1 coupled in series in this order between the second node V2, which has a second potential different from the potentials of the first potential and the input line 76, and the input line 76. Similarly, the second circuit 14-2 includes a second resistance circuit 123-2 and a second switch 124-2 coupled in series in this order between the second node V2 and the input line 76. The second circuit 14-$m$ includes a second resistance circuit 123-$m$ and a second switch 124-$m$ coupled in series in this order between the second node V2 and the input line 76. Each of the second resistance circuits 123-1 to 123-$m$ includes a diode that is reverse-bias-coupled between the second node V2 and the input line 76. Hereinafter, the second resistance circuits 123-1 to 123-$m$ may be simply referred to as second resistance circuits 123, and the second switches 124-1 to 124-$m$ may be simply referred to as second switches 124, when there is no need to distinguish between them.

Each of the first switches 122 and the second switches 124 may be a switching element having the same configuration as the reset switch 145. When the reset switch 145 is a p-type MOSFET, for example, each of the first switches 122 and the second switches 124 may be a p-type MOSFET having the same dimensions as the reset switch 145. When the reset switch 145 is an n-type MOSFET, each of the first switches 122 and the second switches 124 may be an n-type MOSFET having the same dimensions as the reset switch 145.

The control circuit 69 controls the first switches 122 based on the voltage signal Vout to cancel the leakage current Ileak flowing through the feedback capacitance of the capacitor 144. This reduces the influence of the drift in the Q-V conversion circuit 70 and reduces the possibility that the integration circuit 74 and the Q-V conversion circuit 70 do not function normally. In addition, the control circuit 69 can obtain the voltages, current values, and the like in the Q-V conversion circuit 70, and execute processing for controlling the units in the Q-V conversion circuit 70. Hereinafter, the leakage current correction operation of the Q-V conversion circuit 70 for reducing the influence of drift will be described by taking the first correction circuit 11 as an example.

From the equation (7), when the value of the drift is positive in the Q-V conversion circuit 70, the leakage current Ileak having a negative sign flows through the capacitor 144, and a negative electric charge is charged. Accordingly, when the first potential of the first node V1 is higher than the potential of the input line 76, the control circuit 69 controls the first switches 122 to be opened and causes currents each having a positive sign to flow into the input terminal 141, thereby canceling the leakage current Ileak. As a result, drift is reduced. At this time, the currents flowing from the first correction circuit 11 to the input terminal 141 change depending on the characteristics of the first resistance circuits 121. In the case of reverse-bias-coupled diodes, the first resistance circuits 121 allow substantially constant reverse saturation currents to flow without being affected by the first potential of the first node V1, and thus the first potential of the first node V1 may be the voltage VDD.

Next, when the value of the drift is negative in the Q-V conversion circuit 70, the leakage current Ileak having a positive sign flows through the capacitor 144, and a positive electric charge is charged. Accordingly, when the second potential of the second node V2 is lower than the potential of the input line 76, the control circuit 69 controls the second switches 124 to be closed and causes currents each having a negative sign to flow into the input terminal 141, thereby canceling the leakage current Ileak. As a result, drift is reduced. At this time, the currents flowing from the second correction circuit 12 change depending on the characteristics of the second resistance circuits 123. In the case of reverse-bias-coupled diodes, the second resistance circuits 123 allow substantially constant reverse saturation currents to flow without being affected by the second potential of the second node V2, and thus the potential of the second node V2 may be the potential of the digital ground DGND.

As describe above, the Q-V conversion circuit 70 according to the present embodiment controls the first switches 122 and the second switches 124 of the leakage current correction circuit 71 to cancel at least a part of the leakage current Ileak flowing through the capacitor 144. In this manner, it is possible to reduce the drift generated in the integration circuit 74 and correct the voltage signal Vout output from the integration circuit 74.

Next, as a method of controlling the first switches 122 and the second switches 124 of the leakage current correction circuit 71, a method in which the control circuit 69 outputs the control signal VSEL will be described.

The control circuit 69 includes a storage circuit 73 that stores information indicating the control signal VSEL corresponding to the voltage signal Vout. The storage circuit 73 is a nonvolatile memory, for example. The control circuit 69 outputs the control signal VSEL to the leakage current correction circuit 71 by reading information indicating the control signal VSEL corresponding to the voltage signal Vout from the storage circuit 73. The control circuit 69 controls at least any of the first switches 122 and the second switches 124 by the control signal VSEL. In other words, the control circuit 69 controls the open/closed state of each of the first switches 122 and the second switches 124 based on the voltage signal Vout to cancel the leakage current Ileak flowing through the capacitor 144.

The storage circuit 73 may store temperature information obtained from the temperature detection circuit 72 and information indicating the control signal VSEL corresponding to the voltage signal Vout. In this case, the control circuit 69 reads the temperature information and the information indicating the control signal VSEL corresponding to the voltage signal Vout from the storage circuit 73, thereby outputting the control signal VSEL to the leakage current correction circuit 71. In other words, based on the temperature detected by the temperature detection circuit 72 and the voltage signal Vout, the control circuit 69 controls the open/closed state of each of the first switches 122 and the second switches 124 to cancel the leakage current Ileak flowing through the capacitor 144. The information indicating the control signal VSEL stored in the storage circuit 73 indicates, for example, the open/closed state of each of the first switches 122 and the second switches 124 measured in a manufacturing process, an inspection process, or the like of the Q-V conversion circuit 70.

The temperature detection circuit 72 detects the temperature of at least one of the analog circuit board 7, the Q-V conversion circuit 70, and the force sensor 1 including the Q-V conversion circuit 70, and outputs temperature information indicating the detected temperature. The leakage current Ileak flowing through the capacitor 144 changes due to a temperature change of a circuit constituting the Q-V conversion circuit 70. That is to say, the drift generated in the integration circuit 74 varies due to the temperature change. The control circuit 69 generates a control signal VSEL for controlling at least any of the first switches 122 and the second switches 124 to cancel the leakage current Ileak based on the temperature detected by the temperature detection circuit 72. This makes it possible to reduce drift based on the temperature of at least one of the analog circuit board 7, the Q-V conversion circuit 70, and the force sensor 1 including the Q-V conversion circuit 70.

One of the causes of the leakage current Ileak flowing through the capacitor 144 is a current generated due to the potential difference between the two main electrodes of the FET constituting the reset switch 145. This current changes depending on the potential difference between the two main electrodes of the reset switch 145, that is, the potential difference between the input terminal 141 and the output terminal 142 of the integration circuit 74, and this current has no constant value.

The Q-V conversion circuit 70 includes a test voltage generation circuit 77 that applies a test voltage to a test voltage input node 146, and a test switch 78 that switches a coupling destination of a contact of the reset switch 145 on the output terminal 142 side to the output terminal 142 or the test voltage input node 146.

By switching the coupling destination of the reset switch 145 from the output terminal 142 to the test voltage generation circuit 77 by the test switch 78, a potential difference is applied to both ends of the reset switch 145. At this time, the potential on the input terminal 141 side of the reset switch 145 is AGND due to the imaginary short of the operational amplifier 143. Accordingly, the potential difference generated between both ends of the reset switch 145 during the operation of the integration circuit 74 is reproduced by applying a voltage by the test voltage generation circuit 77. A current flowing through the capacitor 144 at this time is equivalent to the leakage current generated when the integration circuit 74 operates when the coupling destination of the reset switch 145 is switched to the output terminal 142.

Figure 6:
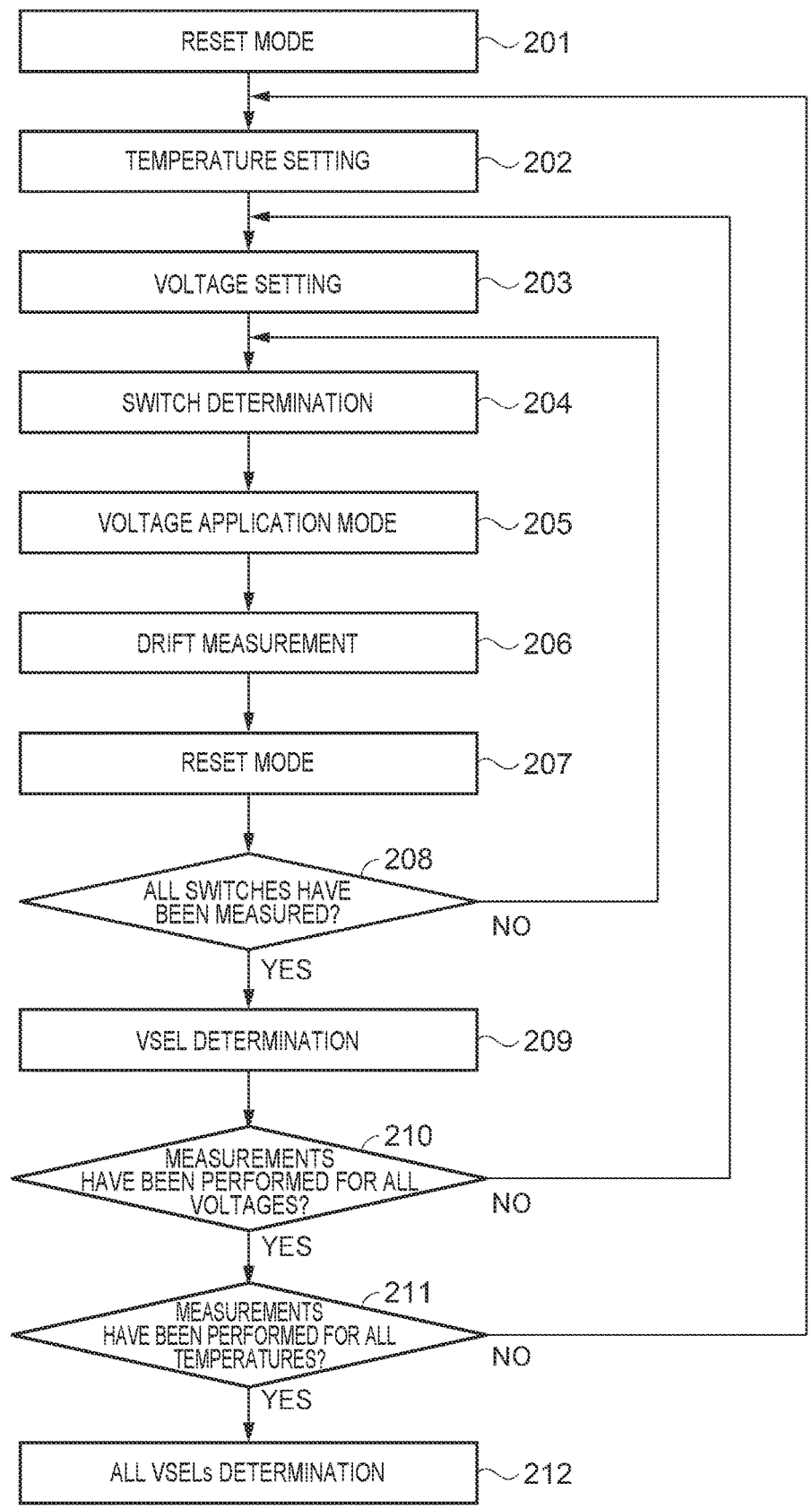
FIG. 6 is a flowchart showing a procedure for determining a control value to be written in a storage circuit.

Next, a method of determining information indicating the control signal VSEL stored in the storage circuit 73 will be described with reference to the flowchart of FIG. 6. When the first resistance circuits 121 and the second resistance circuits 123 are formed of diodes, for the operation of the leakage current correction circuit 71, depending on the manufacturing variation of the reverse saturation current, which switches of the first switches 122 and the second switches 124 is opened or closed is important.

In step 201, the Q-V conversion circuit 70 shifts to a reset mode in which the reset switch 145 is in the closed state and the test switch 78 couples the contact on the output terminal 142 side of the reset switch 145 and the output terminal 142. In the reset mode, each of the first switches 122 and the second switches 124 is in the open state.

In step 202, the temperature of the Q-V conversion circuit 70 is set. The temperature of the Q-V conversion circuit 70 is set to a value in the operating temperature range of the Q-V conversion circuit 70 by, for example, a temperature adjustment apparatus (not shown). Step 202 is continued until the temperature of each block is equal to the set temperature.

In step 203, a test voltage to be applied to the reset switch 145 is set by the test voltage generation circuit 77. The test voltage corresponds to the values of the voltage signals Vout in the operating voltage range of the Q-V conversion circuit 70.

In step 204, it is determined which switches of the first switches 122 and the second switches 124 of the leakage current correction circuit 71 are to be controlled. In the first step 204, all of the first switches 122 and the second switches 124 are in the open state.

In step 205, the Q-V conversion circuit 70 shifts to a voltage application mode in which the reset switch 145 is in the open state, and the contact on the output terminal 142 side of the reset switch 145 and the test voltage input node 146 are coupled to each other by the test switch 78.

In step 206, the drift of the voltage signal Vout, which is the amount of change in the voltage signal Vout per unit time, is measured. When all of the first switches 122 and the second switches 124 are in the open state, the change amount of the voltage signal Vout is the drift of the Q-V conversion circuit 70.

In step 207, the Q-V conversion circuit 70 shifts to the reset mode. That is to say, the reset switch 145 is closed, and the test switch 78 couples the contact on the output terminal 142 side of the reset switch 145 and the output terminal 142. As a result, the electric charge charged in the capacitor 144 is discharged.

In step 208, it is determined whether the measurement has been completed for all of the first switches 122 and the second switches 124. When all the measurements have been completed, the process proceeds to step 209, and when all the measurements have not been completed yet, the process returns to step 204. When the first resistance circuits 121 and the second resistance circuits 123 are diodes, in steps 205 to 207, for example, only the first switch 122-1 is controlled to be in the closed state and the drift is measured. The difference between this drift and the drift when all of the first switches 122 and the second switches 124 are in the open state is the reverse saturation current of the first resistance circuit 121-1. When the same processing is performed for all of the first switches 122 and the second switches 124 to measure the reverse saturation currents of all of the first resistance circuits 121 and the second resistance circuits 123, the process proceeds to step 209.

In step 209, a combination in which the drift of the Q-V conversion circuit 70 is closest to zero at the temperature set in the immediately preceding step 202 and the test voltage set in the immediately preceding step 203 is calculated from the reverse saturation currents of all the first resistance circuits 121 and the second resistance circuits 123. The combination of the first resistance circuits 121 and the second resistance circuits 123, that is to say, the combination of the open/closed states of the first switches 122 and the second switches 124 corresponds to the control signal VSEL in a certain temperature and voltage signal Vout.

In step 210, it is determined whether all values of the voltage signals Vout in the preset operating voltage range have been measured. When all the measurements have been completed, the process proceeds to step 211, and when all the measurements have not been completed yet, the process returns to step 203. The processes from steps 203 to 209 are repeated for all values of the voltage signals Vout in the operating voltage range, whereby the control signal VSEL corresponding to the change in the voltage signal Vout at a certain temperature is determined.

In step 211, it is determined whether measurements at all values in the preset operating temperature range have been performed. When all measurements have not yet been completed, the process returns to step 202. When all measurements have been completed, the control signals VSEL at all temperatures in the operating temperature range and at all voltage signals Vout in the operating voltage range are determined in step 212. By the storage circuit 36 storing these control signals VSEL, the Q-V conversion circuit 70 can effectively reduce the leakage current Ileak in accordance with an actual environment.

Operations and Effects

As described above, the Q-V conversion circuit 70 according to the present embodiment includes the input line 76 through which the electric charge signal Qin input to the integration circuit 74 is propagated, and the leakage current correction circuit 71 coupled to the input line 76. Then, by controlling the opening and closing of the first switches 122 and the second switches 124 of the leakage current correction circuit 71 by the control circuit 69, it is possible to cancel the leakage current Ileak flowing through the capacitor 144. In this manner, the drift in the voltage signal Vout can be reduced. In other words, the Q-V conversion circuit 70 according to the present embodiment can reduce drift caused by manufacturing variations, changes in the voltage signal Vout, temperature, and the like.

Modifications

Figure 7:
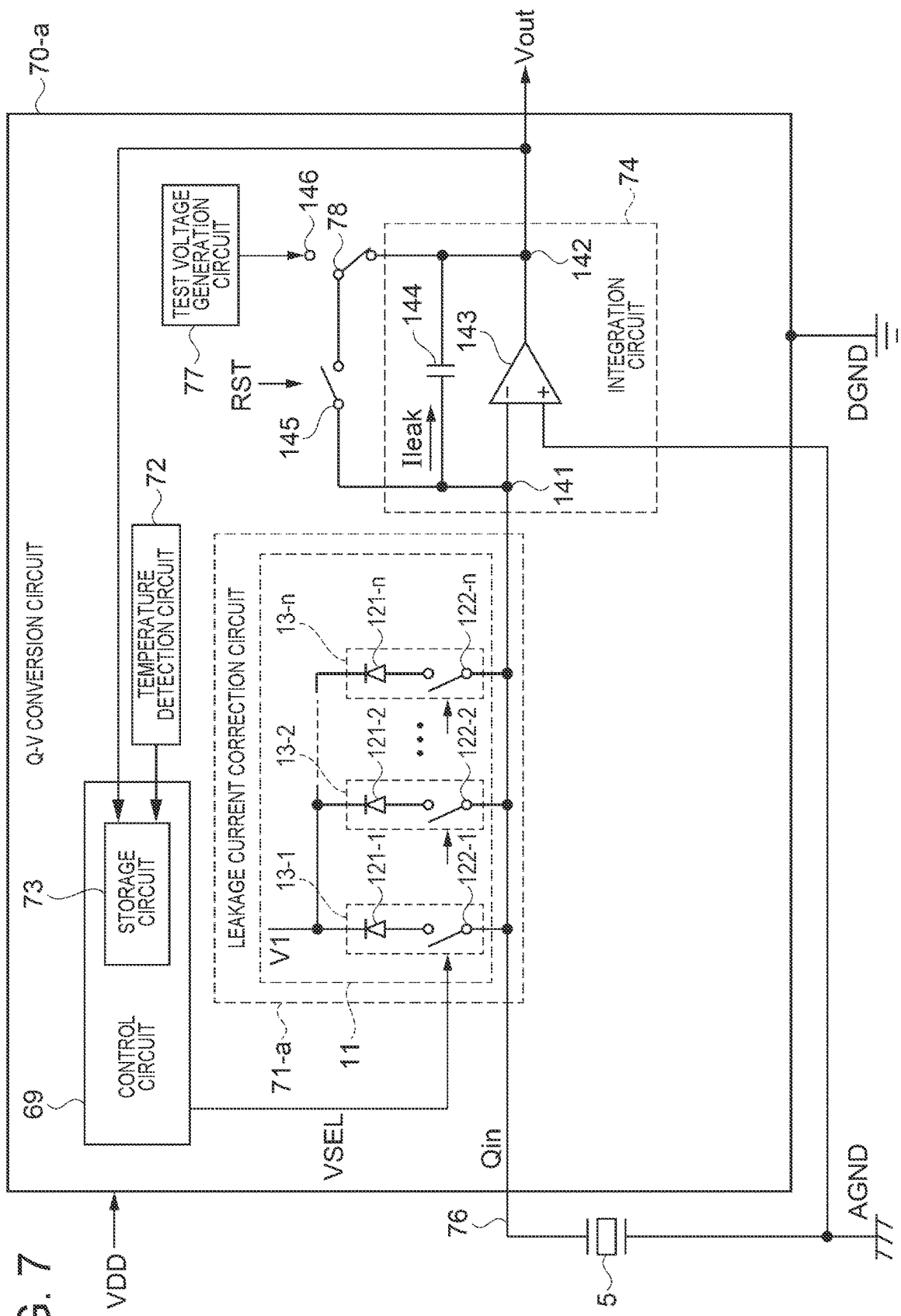
FIG. 7 is a block diagram showing an example of a configuration of a Q-V conversion circuit in a modification of the first embodiment.

As shown in FIG. 7, the Q-V conversion circuit 70 may also be replaced with a Q-V conversion circuit 70-a including a leakage current correction circuit 71-a in which the second correction circuit 12 is omitted, instead of the leakage current correction circuit 71. As described above, when the first potential of the first node V1 is higher than the potential of the input line 76, at least a part of the negative leakage current Ileak can be cancelled.

Figure 8:
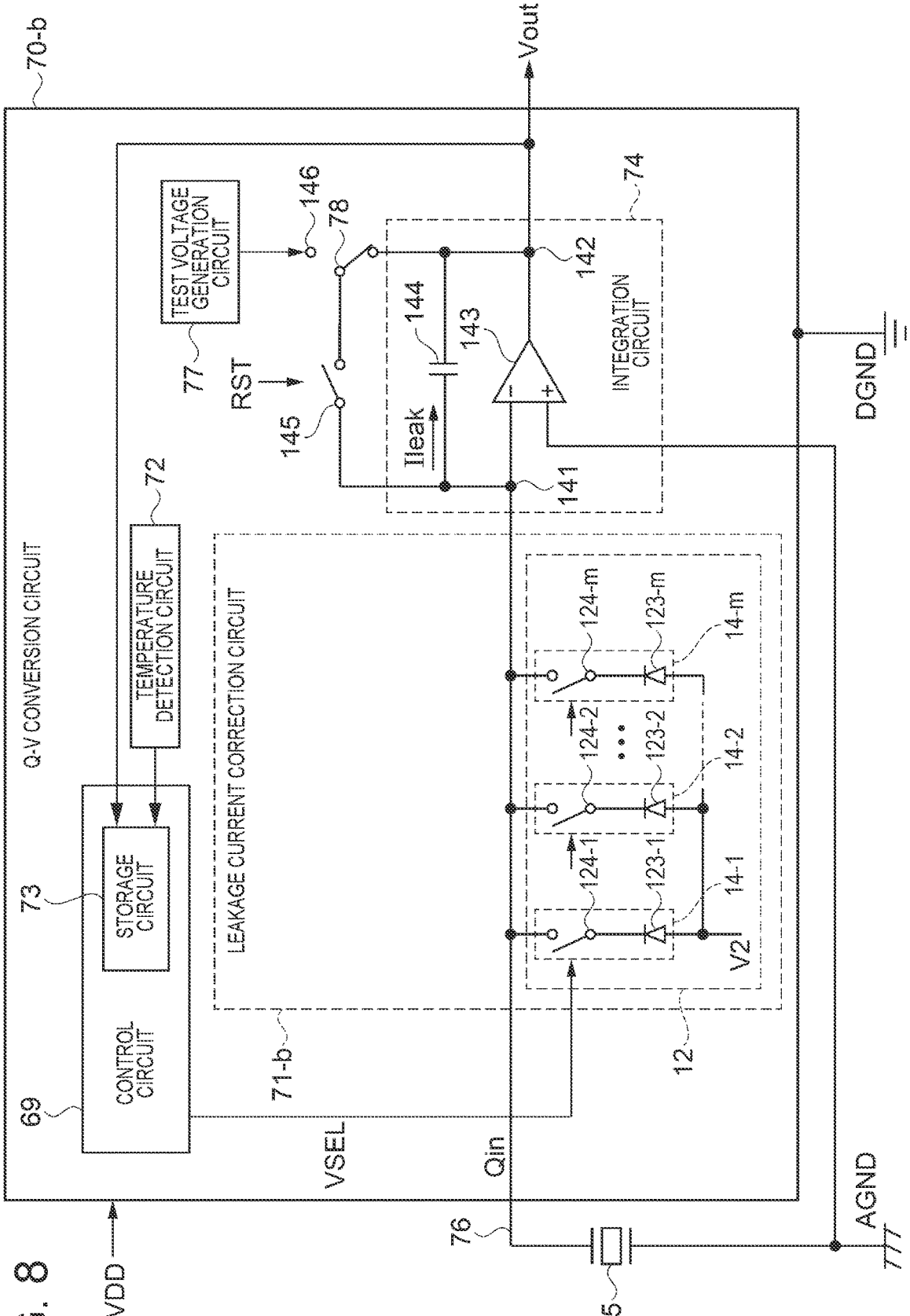
FIG. 8 is a block diagram showing an example of a configuration of a Q-V conversion circuit in another modification of the first embodiment.

Alternatively, as shown in FIG. 8, the Q-V conversion circuit 70 may also be replaced with a Q-V conversion circuit 70-b including a leakage current correction circuit 71-b in which the first correction circuit 11 is omitted, instead of the leakage current correction circuit 71. As described above, when the second potential of the second node V2 is lower than the potential of the input line 76, at least a part of the positive leakage current Ileak can be cancelled. In other words, each of the leakage current correction circuit 71-a and the leakage current correction circuit 71-b can cancel at least a part of the leakage current Ileak by adjusting the first potential or the second potential.

1.2 Second Embodiment

Figure 9:
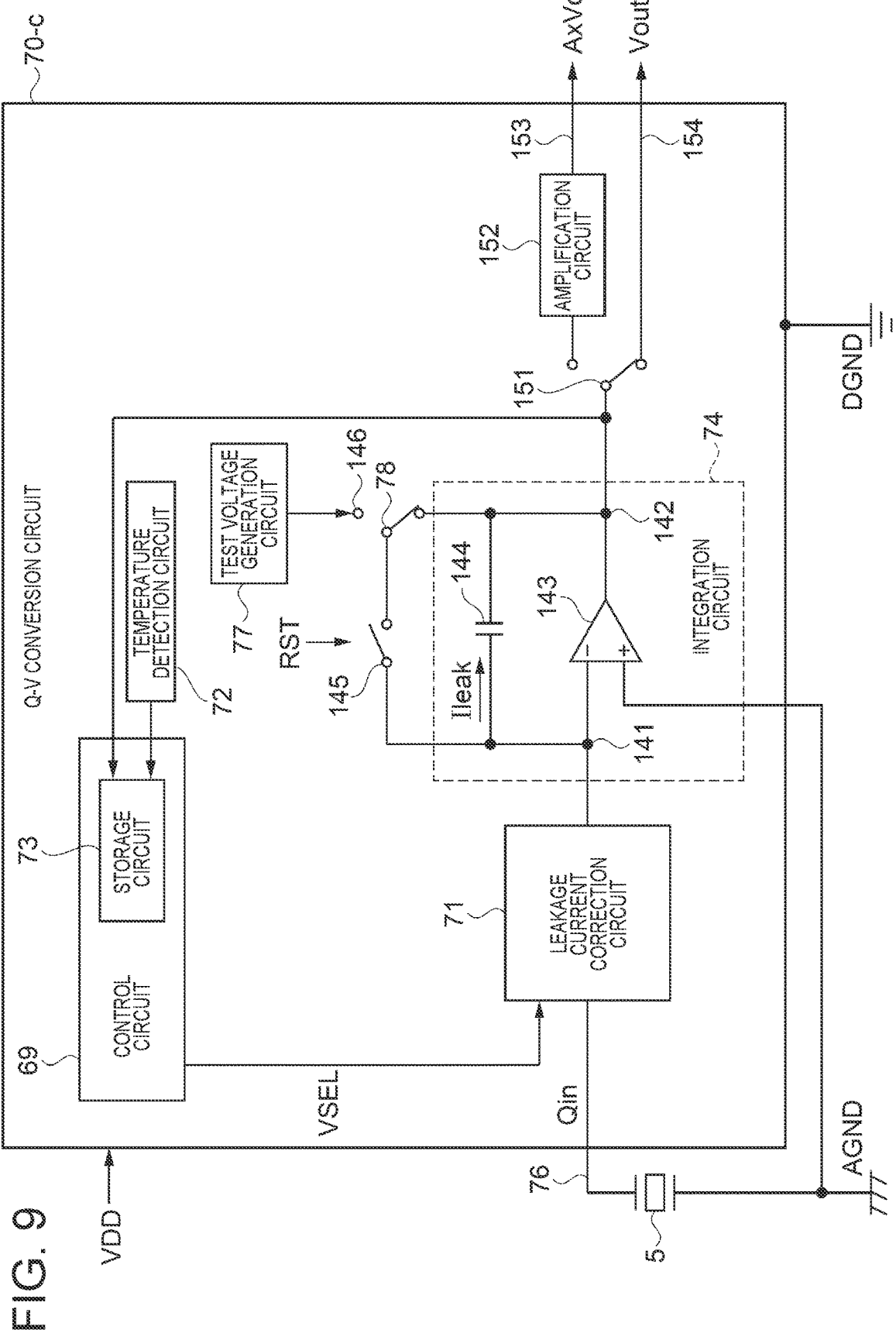
FIG. 9 is a block diagram showing an example of a configuration of a Q-V conversion circuit in a second embodiment.

A Q-V conversion circuit 70-c according to a second embodiment will be described with reference to FIG. 9. In the description of the Q-V conversion circuit 70-c, the same components as those in the first embodiment are denoted by the same reference numerals, and the description thereof will be omitted or simplified. The leakage current correction circuit 71 in FIG. 9 may be the leakage current correction circuit 71-a or the leakage current correction circuit 71-b.

The Q-V conversion circuit 70-c includes an amplification changeover switch 151, an amplification circuit 152, a first output line 153, and a second output line 154. The amplification changeover switch 151 switches the coupling destination of the output terminal 142 to the amplification circuit 152 or the second output line 154. That is to say, the amplification changeover switch 151 switches whether or not to input the voltage signal Vout to the amplification circuit 152. When the voltage signal Vout is input, the amplification circuit 152 amplifies the voltage signal Vout and outputs the amplified voltage signal Vout to the first output line 153. In other words, switching of the amplification changeover switch 151 means selecting the amplification factor of the voltage signal Vout. The signal output from the Q-V conversion circuit 70-c is selected from the voltage signal Vout or the voltage signal A×Vout via the amplification circuit 152 by the amplification changeover switch 151 and the amplification circuit 152.

In the Q-V conversion circuit 70 according to the first embodiment, when determining the information indicating the control signal VSEL to be written into the storage circuit 73, many drift measurements are performed depending on the configuration of the leakage current correction circuit 71, the test voltage, and the temperature, and thus it is highly likely that a long time is required. Accordingly, the cost required for determining the control signal VSEL is likely to be high.

As an example, a case where the capacitance of the capacitor 144 is 100 pF and the leakage current Ileak flowing through the capacitor 144 is 1 fA is considered. When a change in 1 mV needs to occur in the voltage signal Vout to be measured as drift, the time required for one drift measurement is 100 sec. Assuming that there are ten first resistance circuits 121 and ten second resistance circuits 123, ten applied voltages from the test voltage generation circuit 77, and ten ambient temperature settings, it takes 27 hours or more to determine information indicating the control signal VSEL to be written into the storage circuit 73.

The time until the voltage signal A×Vout obtained by multiplying the voltage signal Vout by A by the amplification circuit 152 changes in 1 mV is shortened to 1/A times as compared with the voltage signal Vout. Accordingly, by using the amplification changeover switch 151 at the time of determining the control signal VSEL and setting the coupling destination of the output terminal 142 to the amplification circuit 152, the time until the control signal VSEL is determined can be shortened to 1/A times, and the cost can be reduced. As described above, in the Q-V conversion circuit 70-c, the amplification circuit 152 that amplifies the voltage signal Vout and the amplification changeover switch 151 that selects the amplification factor of the voltage signal Vout provide an effect of reducing the manufacturing cost.

1.3 Third Embodiment

Figure 10:
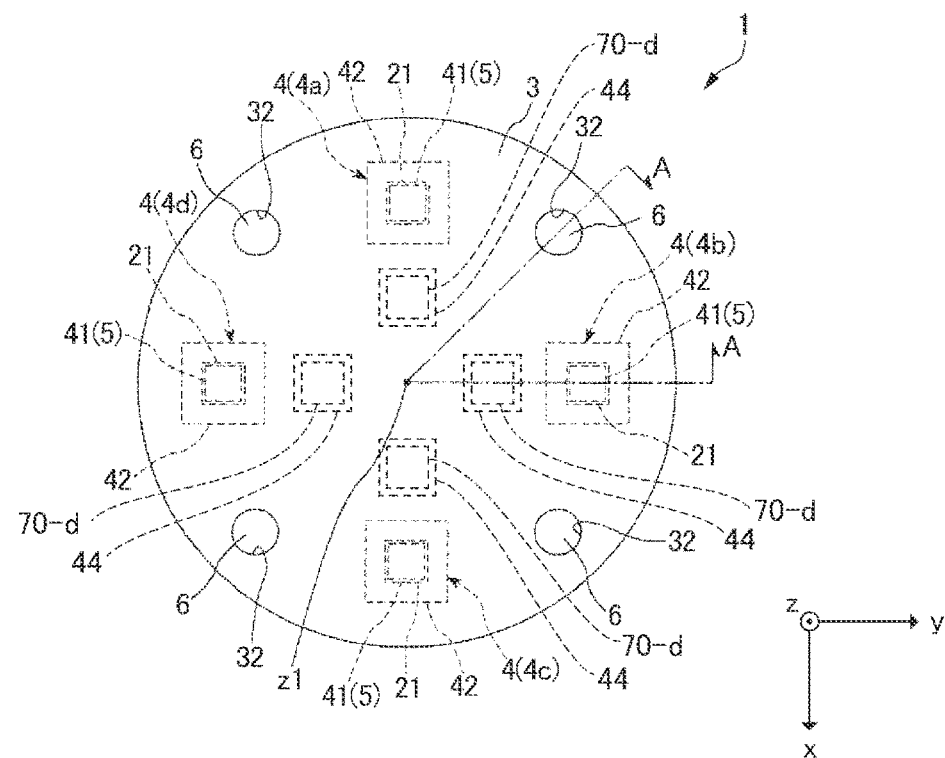
FIG. 10 is a plan view of a configuration of a force sensor in a third embodiment.
Figure 11:
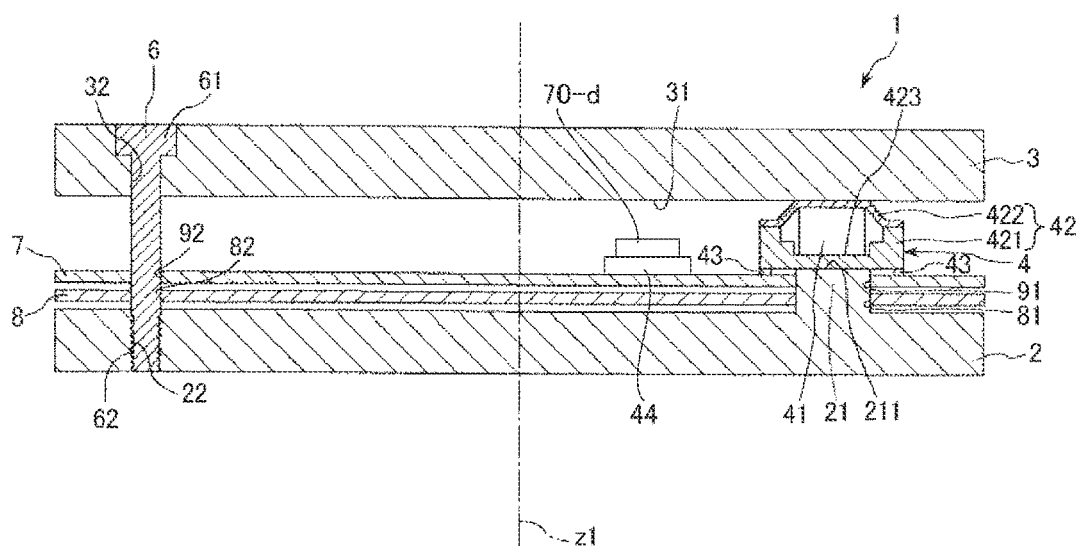
FIG. 11 is a cross-sectional view taken along line A-A of the force sensor shown in FIG. 10.

As shown in FIGS. 10 and 11, a force sensor 1 according to a third embodiment is different from the force sensor 1 according to the above-described first and second embodiments in that the force sensor 1 includes four Q-V conversion circuits 70-d and four thermoelectric elements 44. Configurations, operations, and effects that are not described in the third embodiment are the same as those in the above-described embodiments, and thus redundant description thereof will be omitted. The leakage current correction circuit 71 in FIG. 10 may be the leakage current correction circuit 71-a or the leakage current correction circuit 71-c.

The four thermoelectric elements 44 are arranged on the analog circuit board 7 at equal intervals along the same circumference around the axial line z1, for example. The four Q-V conversion circuits 70-d are disposed on the four thermoelectric elements 44, respectively. That is to say, the force sensor 1 has four rotational symmetries with respect to the axial line z1. The pair of thermoelectric element 44 and the Q-V conversion circuit 70-d are disposed close to the sensor device 4 by being disposed between the sensor device 4 and the axial line z1 in a plan view, that is to say, when viewed from the z-axis direction, for example.

Figure 12:
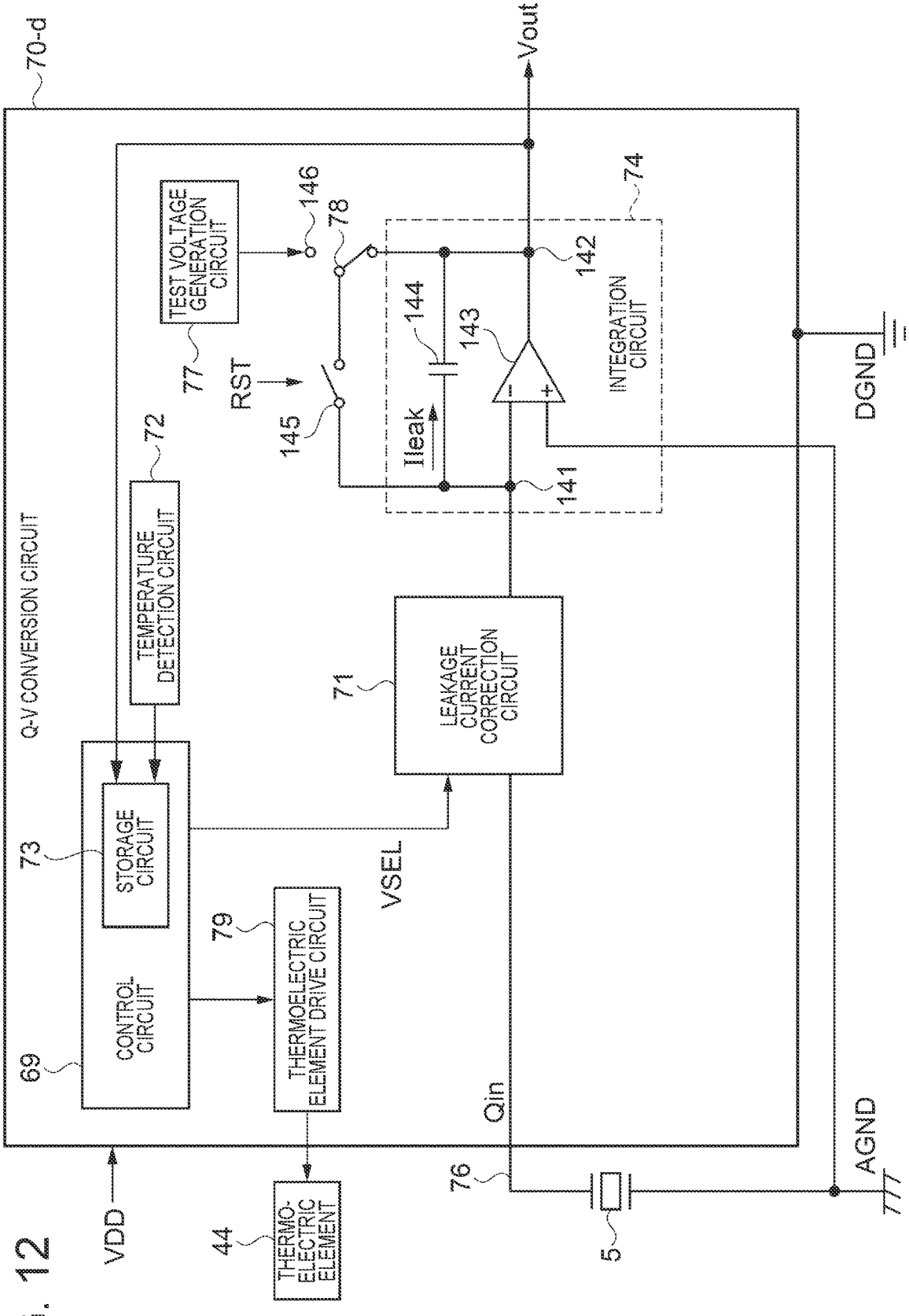
FIG. 12 is a block diagram showing an example of a configuration of a Q-V conversion circuit.

As shown in FIG. 12, each Q-V conversion circuit 70-d includes a thermoelectric element drive circuit 79. The thermoelectric element drive circuit 79 drives the corresponding thermoelectric element 44 in accordance with the control by the control circuit 69. The thermoelectric element 44 is driven by the thermoelectric element drive circuit 79 to adjust the temperature of the leakage current correction circuit 71.

Figure 13:
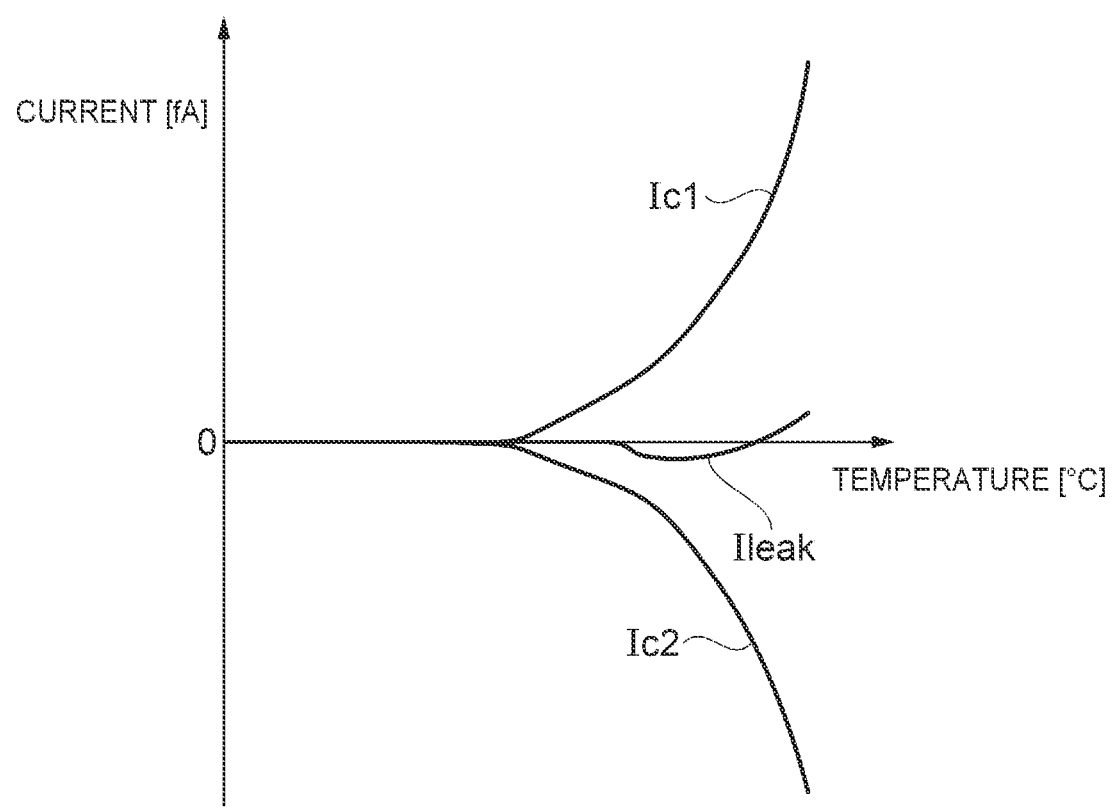
FIG. 13 is a graph showing temperature characteristics of a leakage current correction circuit.

As shown in FIG. 13, a current Ic1 flowing from the first correction circuit 11 into the integration circuit 74 and a current Ic2 flowing from the second correction circuit 12 into the integration circuit 74 change exponentially as the temperature rises. The magnitudes of the currents Ic1 and Ic2 corresponds to the ability to cancel the leakage current Ileak. When the first switches 122 and the second switches 124 are MOSFETs, the ability to cancel the leakage current Ileak changes exponentially due to the influence of the temperature characteristics of the MOSFETs. For this reason, the leakage current Ileak may not be cancelled to zero depending on a temperature.

The control circuit 69 drives the thermoelectric element 44 via the thermoelectric element drive circuit 79 based on the temperature information obtained from the temperature detection circuit 72. Specifically, the control circuit 69 controls the temperature of the Q-V conversion circuit 70-d by the thermoelectric element 44 to maintain the temperature at which the leakage current Ileak is cancelled to zero, whereby the leakage current Ileak can be efficiently cancelled.

As described above, the Q-V conversion circuit 70-d and the thermoelectric element 44 according to the third embodiment can reduce the leakage current Ileak by controlling the temperature of the Q-V conversion circuit 70-d even at a temperature at which the leakage current Ileak caused by a temperature rise cannot be cancelled. With this configuration, the influence of the drift in each Q-V conversion circuit 70-d can be reduced, and the usable temperature range can be expanded.

2. Robot

Next, an example of a robot 1000 including the force sensor 1 including the above-described Q-V conversion circuit 70 will be described with reference to FIG. 14.

Figure 14:
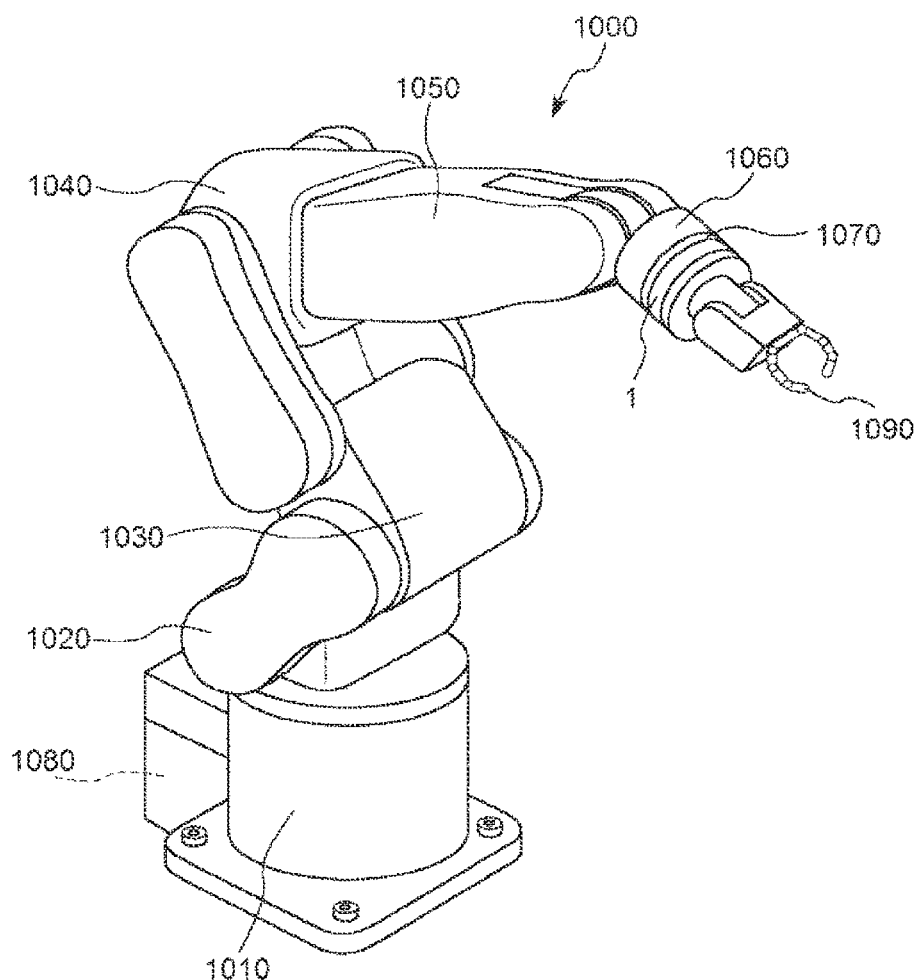
FIG. 14 is a perspective view showing an example of a robot.

As shown in FIG. 14, the robot 1000 is a six-axis robot, and includes: a base 1010 fixed to a floor or a ceiling; an arm 1020 rotatably coupled to the base 1010; an arm 1030 rotatably coupled to the arm 1020; an arm 1040 rotatably coupled to the arm 1030; an arm 1050 rotatably coupled to the arm 1040; an arm 1060 rotatably coupled to the arm 1050; an arm 1070 rotatably coupled to the arm 1060; and a control unit 1080 for controlling driving of the arms 1020, 1030, 1040, 1050, 1060, and 1070. The arm 1070 is provided with a hand coupling portion, and an end effector 1090 corresponding to work to be performed by the robot 1000 is attached to the hand coupling portion. The robot 1000 can perform work such as supply, removal, conveyance, and assembly of precision equipment and components constituting the precision equipment.

In the robot 1000, the force sensor 1 described above is provided in the vicinity of the end effector 1090 in order to detect an external force applied to the end effector 1090. Then, by feeding back the force detected by the force sensor 1 to the control unit 1080, the robot 1000 can perform more precise work. Furthermore, the robot 1000 detects contact or the like of the end effector 1090 with an obstacle by the force detected by the force sensor 1. In this manner, the robot 1000 can perform an obstacle avoidance operation, an object damage avoidance operation, and the like, and the robot 1000 can perform work more safely. Also, in the robot 1000, the force sensors 1 serving as torque sensors may also be disposed at the joint portions of the arms 1020, 1030, 1040, 1050, 1060, and 1070.

In the force sensor 1 included in the robot 1000 described above, the influence of the drift in which the output of the integration circuit 74 included in the Q-V conversion circuit 70 varies with time is reduced. Accordingly, in the robot 1000, it is possible to reduce the number of times of performing the reset operation in order to reduce the influence of the drift. Therefore, the robot 1000 including the force sensor 1 described above can perform continuous operation for a long time.

In FIG. 14, the robot 1000 includes five arms. However, the number of arms included in the robot 1000 is not limited thereto, and may be one to four, or six or more.

Although the embodiments and the modifications have been described above, the present disclosure is not limited to these embodiments and can be carried out in various aspects without departing from the spirit thereof. The above-described embodiments may be appropriately combined, for example.

The present disclosure includes substantially the same configuration as the configuration described in the embodiments (for example, a configuration having the same function, method, and result, or a configuration having the same object and effect). In addition, the present disclosure includes a configuration in which a non-essential portion of the configuration described in the embodiments is replaced. Also, the present disclosure includes a configuration that achieves the same operations and effects as the configuration described in the embodiments or a configuration that can achieve the same object as the configuration described in the embodiments. Furthermore, the present disclosure includes a configuration in which a known technique is added to the configuration described in the embodiments.

What is claimed is:

1. A charge amplifier configured to convert an electric charge signal into a voltage signal, the charge amplifier comprising:
    an input line configured to propagate the electric charge signal;
    an integration circuit including an input terminal coupled to the input line and an output terminal that outputs the voltage signal;
    a reset switch configured to reset the voltage signal by electrically connecting between the input terminal and the output terminal;
    a leakage current correction circuit including a first resistance circuit and a first switch coupled in series between a first node, and the input line, the first node is applied a first potential different from a potential of the input line; and
    a control circuit configured to control the first switch based on the voltage signal to cancel at least a part of a leakage current flowing through the integration circuit,
    wherein the first switch and the reset switch are separate from each other and are disposed at different positions in the charge amplifier.

2. The charge amplifier according to claim 1, wherein the first resistance circuit includes a diode that is reverse-bias coupled between the first node and the input line.

3. The charge amplifier according to claim 1, wherein the control circuit includes a storage circuit configured to store information indicating a control signal that corresponds to the voltage signal and controls the first switch.

4. The charge amplifier according to claim 1, comprising:
    a temperature detection circuit configured to detect a temperature, wherein
    the control circuit controls the first switch so as to cancel at least a part of the leakage current based on the temperature detected by the temperature detection circuit.

5. The charge amplifier according to claim 1, wherein the leakage current correction circuit includes a second resistance circuit and a second switch coupled in series between a second node, which has a second potential different from both the first potential and the potential of the input line, and the input line.

6. The charge amplifier according to claim 5, wherein the second resistance circuit includes a diode that is reverse-bias coupled between the second node and the input line.

7. The charge amplifier according to claim 1, further comprising:
    a test voltage generation circuit configured to apply a test voltage to a test voltage input node; and
    a test switch configured to switch a coupling destination of a contact on the output terminal side of the reset switch to the output terminal or the test voltage input node.

8. The charge amplifier according to claim 1, further comprising:
    an amplification circuit configured to amplify the voltage signal; and
    an amplification changeover switch configured to switch whether or not to input the voltage signal to the amplification circuit.

9. A force sensor, comprising:
    the charge amplifier according to claim 1; and
    a force detection element configured to detect an external force and output the electric charge signal corresponding to the external force.

10. The force sensor according to claim 9, further comprising
    a thermoelectric element configured to adjust a temperature of the leakage current correction circuit.

11. A robot comprising the force sensor according to claim 9.

* * * * *